United States Patent
Chiang

(10) Patent No.: US 11,682,557 B2
(45) Date of Patent: Jun. 20, 2023

(54) RECOGNITION METHOD FOR PHOTOLITHOGRAPHY PROCESS AND SEMICONDUCTOR DEVICE

(71) Applicant: Winbond Electronics Corp., Taichung (TW)

(72) Inventor: Chih-Yu Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 156 days.

(21) Appl. No.: 17/242,310

(22) Filed: Apr. 28, 2021

(65) Prior Publication Data

US 2021/0391167 A1 Dec. 16, 2021

(30) Foreign Application Priority Data

Jun. 12, 2020 (TW) ................................ 109119926

(51) Int. Cl.
| | | |
|---|---|---|
| *H01L 21/027* | (2006.01) | |
| *H01L 23/544* | (2006.01) | |
| *H01L 21/66* | (2006.01) | |
| *H01L 23/58* | (2006.01) | |
| *H01L 21/308* | (2006.01) | |

(52) U.S. Cl.
CPC ...... *H01L 21/0274* (2013.01); *H01L 21/3086* (2013.01); *H01L 22/12* (2013.01); *H01L 23/544* (2013.01); *H01L 23/585* (2013.01); *H01L 2223/5442* (2013.01); *H01L 2223/54426* (2013.01); *H01L 2223/54453* (2013.01); *H01L 2223/54466* (2013.01)

(58) Field of Classification Search
CPC .... H01L 21/3086; H01L 22/12; H01L 23/544
See application file for complete search history.

(56) References Cited

U.S. PATENT DOCUMENTS

| | | | |
|---|---|---|---|
| 9,105,699 B2* | 8/2015 | Farys | ................ H01L 21/76838 |
| 9,972,574 B2* | 5/2018 | Shiba | .................... G03F 9/7046 |
| 10,354,959 B2* | 7/2019 | Shiba | ........................ G03F 7/20 |
| 11,355,348 B2* | 6/2022 | Lugani | ............. H01L 21/32139 |
| 2012/0045901 A1* | 2/2012 | Kim | .................. H01L 21/31144 |
| | | | 257/E21.257 |

(Continued)

FOREIGN PATENT DOCUMENTS

CN 106057654 1/2018

*Primary Examiner* — Bilkis Jahan
*Assistant Examiner* — Victor V Barzykin
(74) *Attorney, Agent, or Firm* — JCIPRNET

(57) ABSTRACT

A recognition method for photolithography process and a semiconductor device are provided. The recognition method includes forming a mask layer on a semiconductor substrate, and then patterning the mask layer to form multiple dense line patterns in a cell region and multiple dummy dense line patterns in an interface region between the cell region and a peripheral region. At least one connection portion is provided between a first and a third dummy dense line patterns, and a second dummy dense line pattern is discontinuous at and separated from the at least one connection portion. A photoresist layer covering the peripheral region is formed on the semiconductor substrate, and whether a landing position of the photoresist layer is correct is determined according to a distance from an edge of the photoresist layer to a closest dummy dense line pattern and a width of the at least one connection portion.

14 Claims, 19 Drawing Sheets

(56) References Cited

U.S. PATENT DOCUMENTS

| | | | |
|---|---|---|---|
| 2016/0079179 A1* | 3/2016 | Shiba | G03F 9/7046 |
| | | | 438/14 |
| 2016/0293478 A1* | 10/2016 | Yuan | H01L 21/76877 |
| 2018/0286692 A1* | 10/2018 | Chen | H01L 21/3086 |
| 2019/0181014 A1* | 6/2019 | Chang | H01L 21/823468 |
| 2020/0035498 A1* | 1/2020 | Lugani | H01L 21/32139 |
| 2020/0266071 A1* | 8/2020 | Lugani | H01L 21/3081 |

\* cited by examiner

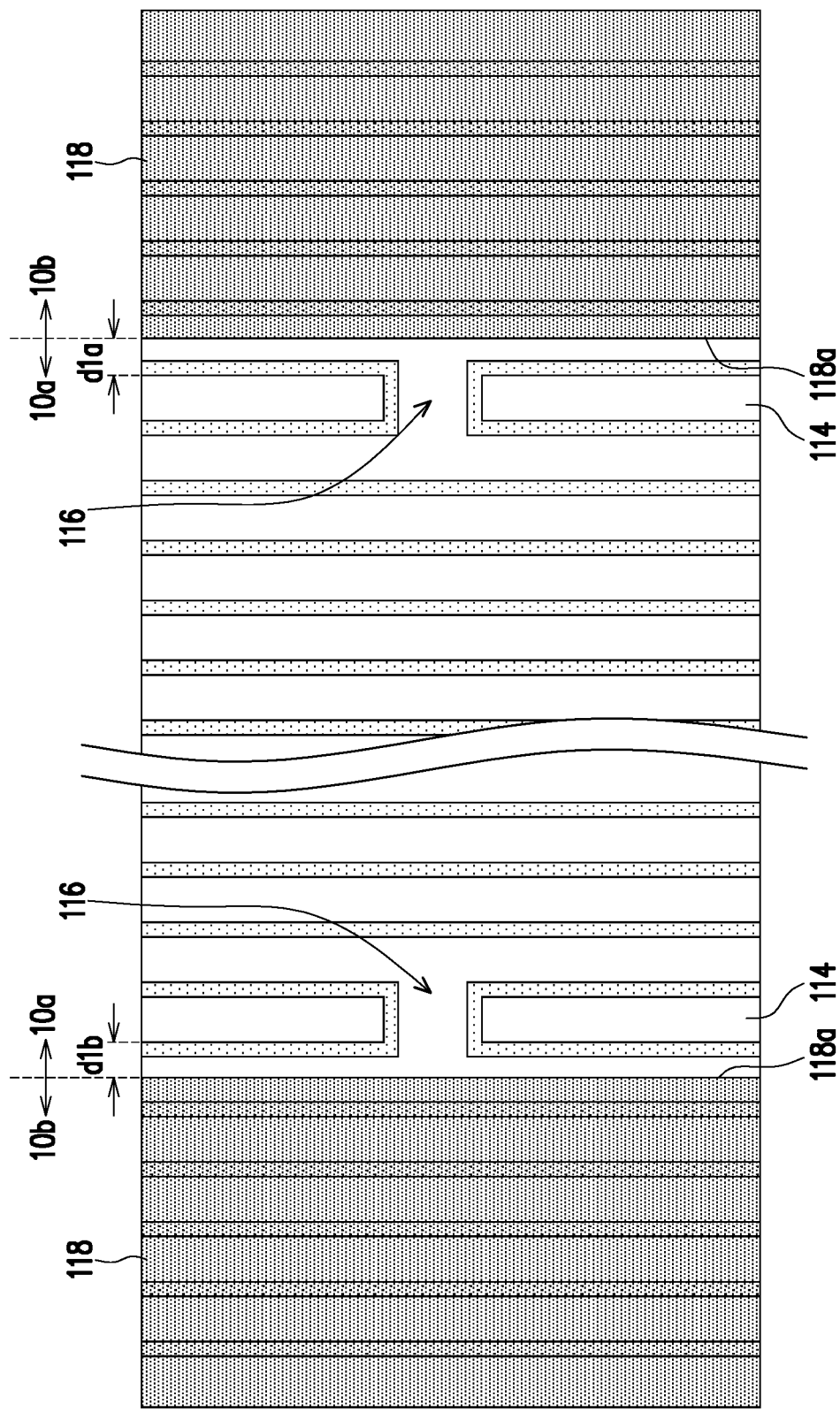

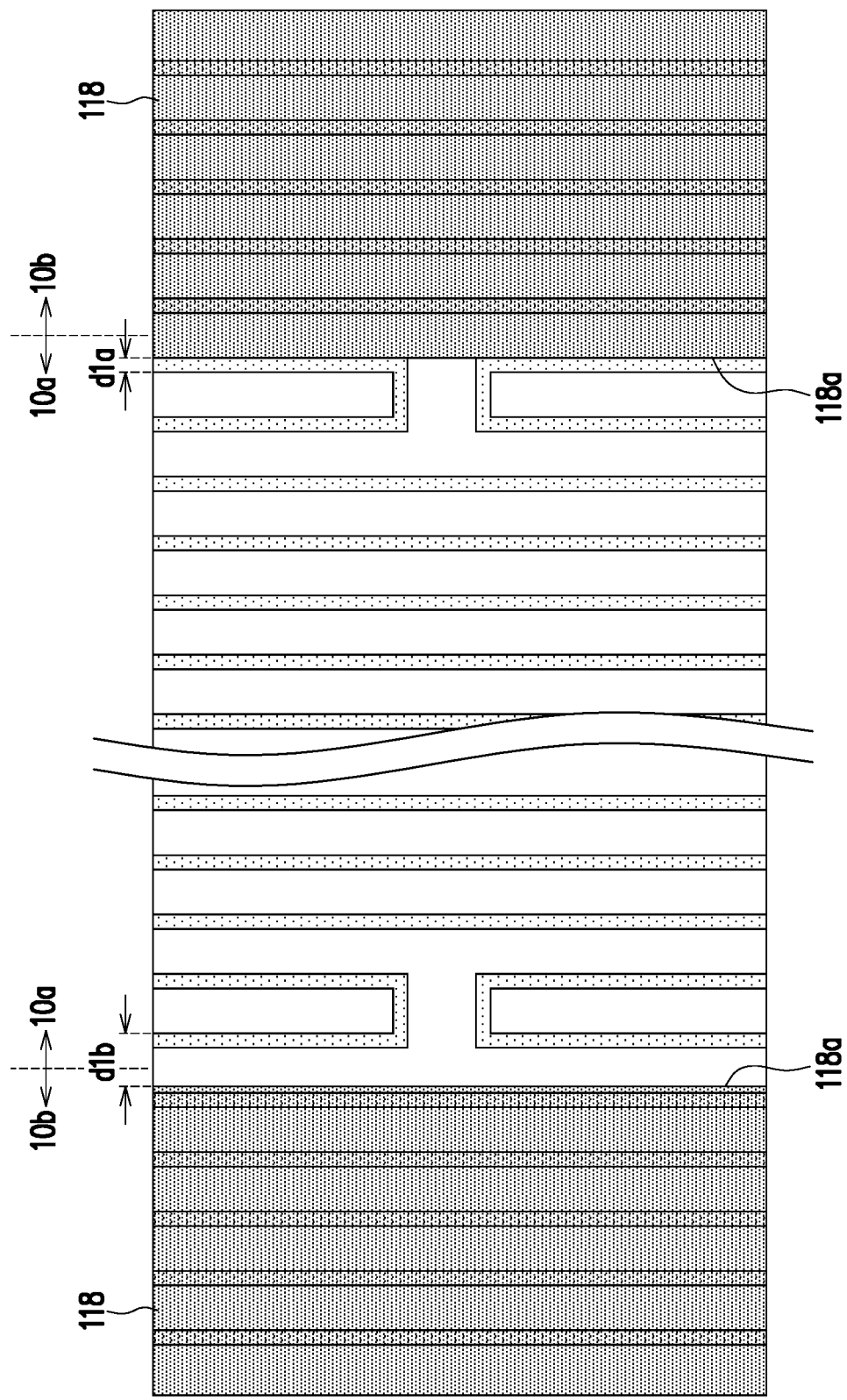

RECOGNITION METHOD FOR PHOTOLITHOGRAPHY PROCESS AND SEMICONDUCTOR DEVICE

CROSS-REFERENCE TO RELATED APPLICATION

This application claims the priority benefit of Taiwan application serial no. 109119926, filed on Jun. 12, 2020. The entirety of the abovementioned patent application is hereby incorporated by reference herein and made a part of this specification.

BACKGROUND

Technical Field

This disclosure relates to a semiconductor process technology, and in particular to a recognition method for a photolithography process and a semiconductor device.

Description of Related Art

Lithography is a pivotal technology in a semiconductor device manufacturing process, and is a step that determines everything related to a metal oxide semiconductor device structure, for example, patterns of each film layer and doped regions. In general, a lithography process includes photoresist coating, exposure and development. In the exposure step, a light source irradiates a photoresist via a photomask to cause a photochemical change in an exposure region of the photoresist. Then, by baking and development, a photomask pattern can be transferred to the photoresist and a patterned photoresist layer is formed.

As the density of integrated circuits increases, the size (line width) of the entire semiconductor device decreases. Therefore, in response to the miniaturization of the device, a self-aligned double patterning (SADP) process has been developed to overcome the limitations of current photolithography processes, in which a line/space ratio can be reduced to the nanometer scale, thereby miniaturizing the device.

However, in the SADP process, since a dense line mask formed on a semiconductor substrate usually has constant line width and line space, it is difficult to distinguish between different patterns generated (i.e., perform core-gap recognition), and it is also not easy to determine a boundary between a cell region and a peripheral region. As a result, a landing position of the subsequent patterned photoresist layer is affected.

In addition, since the landing position (edge) of the patterned photoresist layer is set at the design stage of the device, there has been a huge demand for a method capable of online recognizing whether the landing position of the photoresist layer is correct.

SUMMARY

The disclosure provides a recognition method for a photolithography process, which directly determines a boundary between a cell region and a peripheral region, and online recognizes whether a landing position of a photoresist layer is correct.

The disclosure provides a semiconductor device, which is a semiconductor device with a specific structure fabricated by the abovementioned recognition method.

The recognition method for a photolithography process of the disclosure includes the following steps. A mask layer is formed on a semiconductor substrate that includes a cell region and a peripheral region. The mask layer is patterned to form multiple dense line patterns in the cell region and multiple dummy dense line patterns in an interface region between the cell region and the peripheral region. At least one connection portion is provided between a first and a third of the multiple dummy dense line patterns. A second of the multiple dummy dense line patterns is discontinuous at the at least one connection portion and separated from the at least one connection portion. A photoresist layer covering the peripheral region is formed on the semiconductor substrate. Whether a landing position of the photoresist layer is correct is determined according to a distance from an edge of the photoresist layer to a closest one of the multiple dummy dense line patterns and a width of the at least one connection portion.

In an embodiment of the disclosure, in a case where the photoresist layer is set to cover the first of the multiple dummy dense line patterns, the landing position of the photoresist layer is determined to be incorrect in response to the distance from the edge of the photoresist layer to the closest one of the multiple dummy dense line patterns being smaller than a distance between the first and the second of the multiple dummy dense line patterns.

In an embodiment of the disclosure, in a case where the photoresist layer is set to cover the first of the multiple dummy dense line patterns, the landing position of the photoresist layer is determined to be incorrect in response to a measured value being unable to be obtained by a critical dimension scanning electron microscope (CD-SEM).

In an embodiment of the disclosure, in a case where the photoresist layer is set to cover the second of the multiple dummy dense line patterns, the landing position of the photoresist layer is determined to be incorrect in response to the distance from the edge of the photoresist layer to the closest one of the multiple dummy dense line patterns being smaller than the distance between the first and the second of the multiple dummy dense line patterns.

In an embodiment of the disclosure, in a case where the photoresist layer is set to cover the second of the multiple dummy dense line patterns, the landing position of the photoresist layer is determined to be incorrect in response to a measured value being unable to be obtained by a CD-SEM.

In an embodiment of the disclosure, the recognition method may further include the following. A critical dimension (CD) value of the photoresist layer is estimated according to a value of the distance between opposite sides (from the edge of the photoresist layer to the closest one of the multiple dummy dense line patterns).

In an embodiment of the disclosure, the recognition method may further include the following. An overlap amount is measured according to a difference in the distance between opposite sides (from the edge of the photoresist layer to the closest one of the dummy dense line pattern).

In an embodiment of the disclosure, a method for patterning the mask layer includes a self-aligned double patterning (SADP) process.

The semiconductor device of the disclosure includes a semiconductor substrate that includes a cell region and a peripheral region, multiple dense line structures and a truncating circuit. The multiple dense line structures are formed in or on the semiconductor substrate.

The multiple dense line structures are obtained by carrying out an etching process or a deposition process using the multiple dense line patterns in the abovementioned recognition method as a mask, and the multiple dense line structures and the multiple dense line patterns are complementary patterns. The truncating circuit is disposed on an interface between the multiple dense line structures and the peripheral region. The truncating circuit is obtained by carrying out an etching process or a deposition process using the photoresist layer and the multiple dummy dense line patterns in the abovementioned recognition method as a mask. The truncating circuit and the first to the third of the multiple dummy dense line patterns are complementary patterns, and the truncating circuit has at least one truncating portion complementary to the at least one connection portion of the dummy dense line patterns.

In another embodiment of the disclosure, the multiple dense line structures include a buried word line (BWL), a bit line (BL), or a shallow trench isolation (STI) structure.

In another embodiment of the disclosure, a line width of the truncating circuit is equal to a line width of the multiple dense line structures.

In another embodiment of the disclosure, the truncating circuit includes multiple extensions adjacent to the at least one truncating portion and extending toward the peripheral region.

In another embodiment of the disclosure, the truncating circuit is constituted by multiple closed rings, and the at least one truncating portion is disposed between two of the multiple closed rings.

In another embodiment of the disclosure, a line width of each of the multiple closed rings is equal to a line width of the multiple dense line structures.

Based on the above, in the disclosure, a photolithography process is carried out using a mask layer with a specific pattern, in which not only can the boundary between the cell region and the peripheral region be directly determined, but it can also be online recognized whether the landing position of the photoresist layer is correct. In addition, the abovementioned recognition method may also be applied to detection of critical dimension (CD) and overlap.

To make the disclosure more comprehensible, several embodiments accompanied by drawings are described in detail as follows.

BRIEF DESCRIPTION OF THE DRAWINGS

FIG. 10A is a top view of the first embodiment applied to critical dimension (CD) detection.

FIG. 10B is a top view of the first embodiment applied to overlap detection.

DESCRIPTION OF THE EMBODIMENTS

FIGS. 1A, 2A, 3A, 4A, 5A, and 6A are schematic top views of a manufacturing process of a recognition method for a photolithography process according to a first embodiment of the disclosure. FIGS. 1B, 2B, 3B, 4B, 5B, and 6B are respectively schematic cross-sectional views of FIGS. 1A, 2A, 3A, 4A, 5A, and 6A taken along the line X-X'. FIGS. 1C, 2C, 3C, 4C, 5C, and 6C are respectively schematic cross-sectional views of FIGS. 1A, 2A, 3A, 4A, 5A, and 6A taken along the line Y-Y'.

Figure 1A:
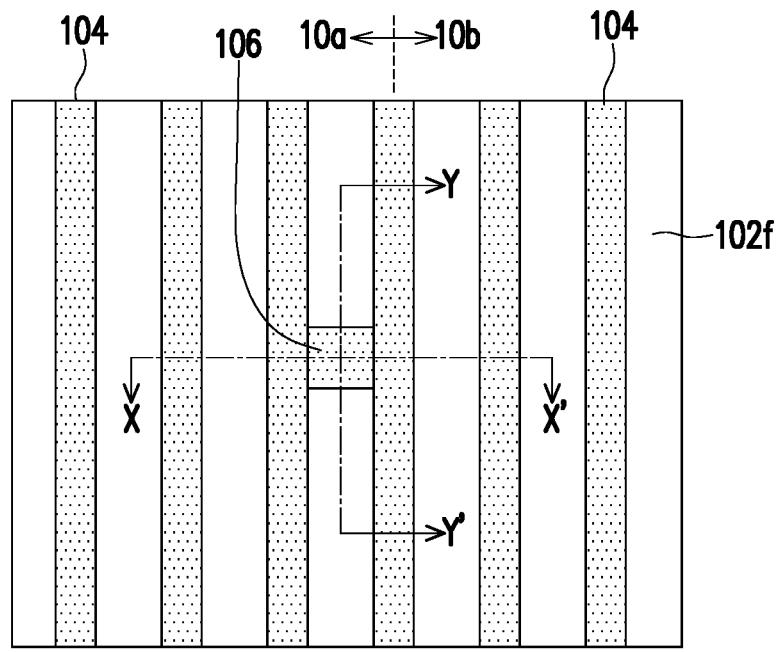
FIGS. 1A, 2A, 3A, 4A, 5A, and 6A are schematic top views of a manufacturing process of a recognition method for a photolithography process according to a first embodiment of the disclosure.
Figure 1B:
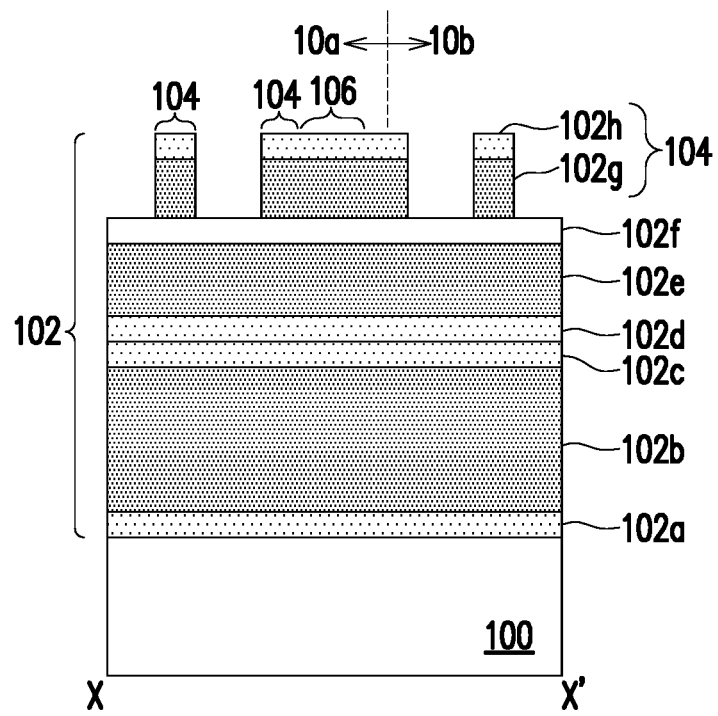
FIGS. 1B, 2B, 3B, 4B, 5B, and 6B are respectively schematic cross-sectional views of FIGS. 1A, 2A, 3A, 4A, 5A, and 6A taken along line X-X'.
Figure 1C:
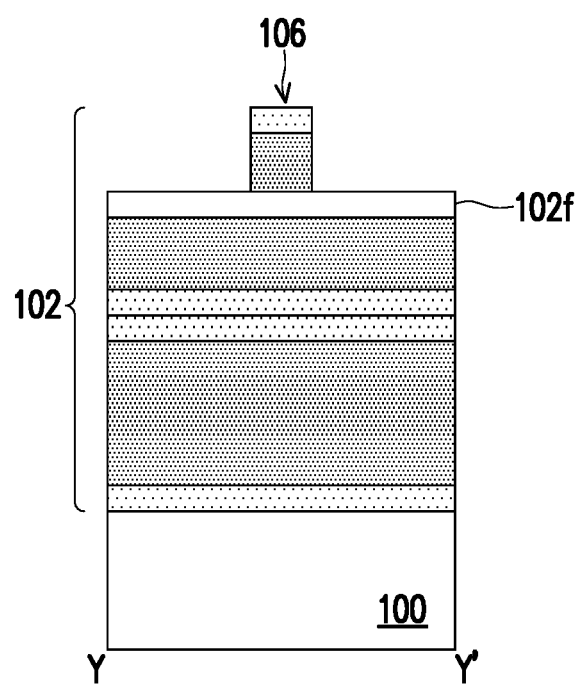
FIGS. 1C, 2C, 3C, 4C, 5C, and 6C are respectively schematic cross-sectional views of FIGS. 1A, 2A, 3A, 4A, 5A, and 6A taken along line Y-Y'.

With reference to FIGS. 1A, 1B, and 1C, a mask layer 102 is formed on a semiconductor substrate 100 that includes a cell region 10a and a peripheral region 10b. The semiconductor substrate 100 may be formed of at least one semiconductor material selected from the group consisting of silicon (Si), germanium (Ge), silicon-germanium (SiGe), gallium phosphide (GaP), gallium arsenide (GaAs), silicon carbide (SiC), silicon-germanium-carbon (SiGeC), indium arsenide (InAs), and indium phosphide (InP). In addition, although not illustrated, in an embodiment, a device isolation structure (such as a shallow trench isolation (STI) structure), a doped region (such as a well region), etc. may be formed in the semiconductor substrate 100. The mask layer 102 may be constituted by material layers 102a, 102b, 102c, 102d, 102e, 102f, 102g, and 102h with different etch selectivities. For example, adjacent material layers are different from each other, and non-adjacent material layers may be the same or different. In an embodiment, the material layers 102a to 102h from bottom to top are respectively made of, for example, plasma enhanced tetraethyl orthosilicate (PE-TEOS) silicon oxide, diamond-like carbon (DLC), nitrogen-rich silicon oxynitride (N—SiON), silicon-rich silicon oxynitride (Si—SiON), DLC, oxygen-rich silicon oxynitride (O—SiON), spin-on carbon (SOC) and a spin-on self-assembly (SOSA) material. However, the disclosure is not limited thereto. The selection and arrangement of the aforementioned materials may be changed according to requirements, some of the material layers may be omitted, or other material layers may be added to the material layers 102a to 102h. After that, in order to pattern the mask layer 102, a method such as a self-aligned double patterning (SADP) process may be used, where the material layers 102g and 102h are first patterned by photolithography to form multiple line patterns 104. At the same time, a connection block 106 is formed between a first and a second line patterns 104 adjacent to an interface between the cell region 10a and the peripheral region 10b.

Figure 2A:
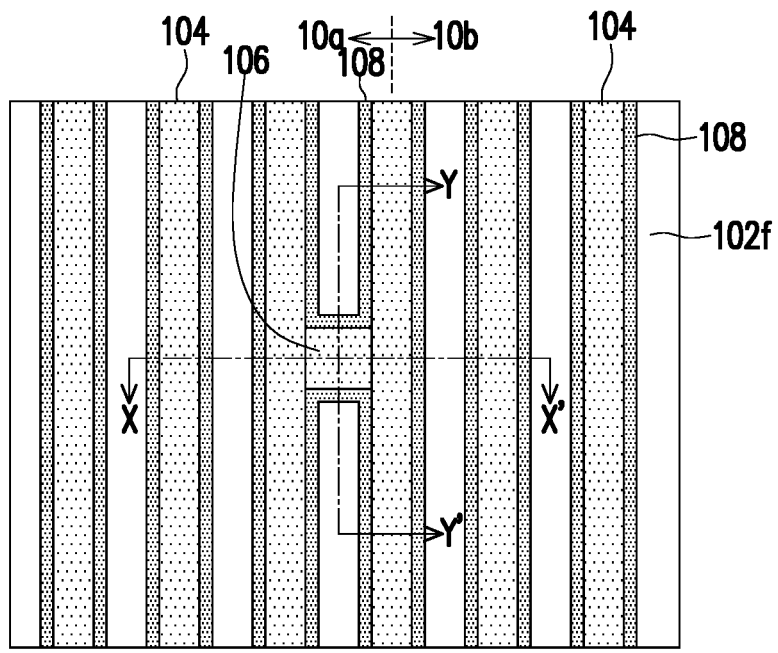
Figure 2B:
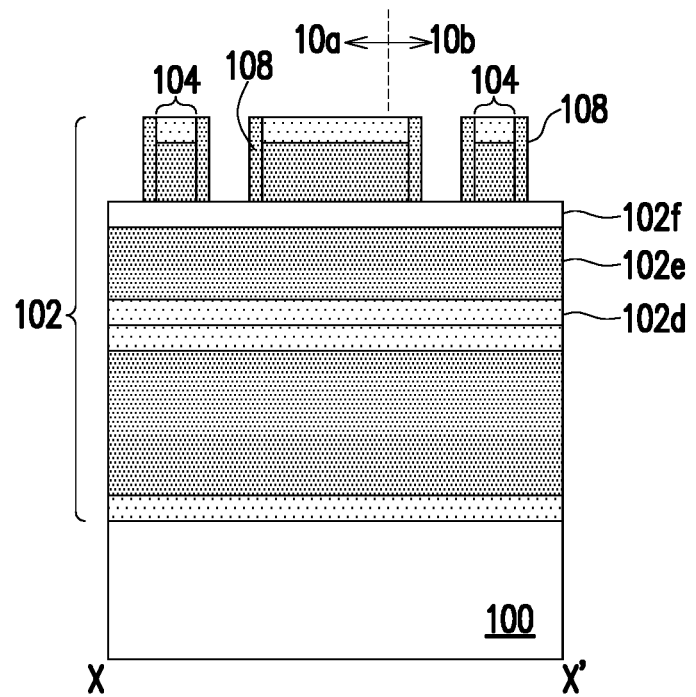
Figure 2C:
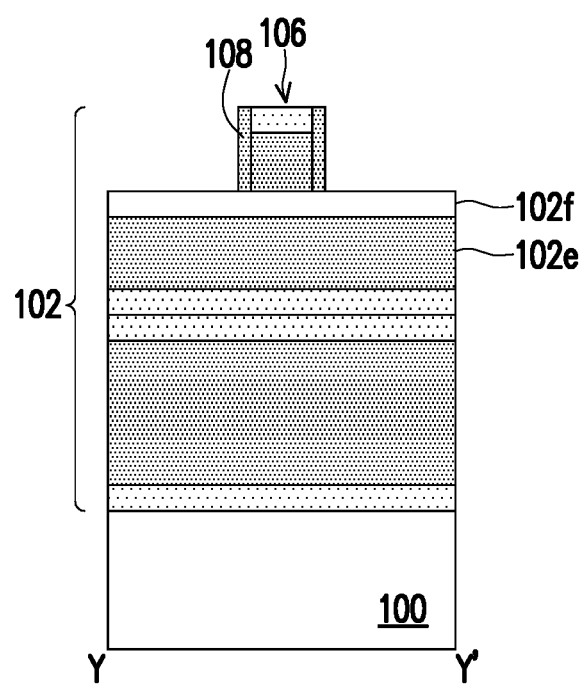

Next, with reference to FIGS. 2A, 2B, and 2C, a spacer 108 is formed on each of sidewalls of the line patterns 104 and the connection block 106. The formation method of the spacer 108 includes, for example, depositing a material of the spacer 108 conformally on each of the line patterns 104 and the connection block 106, and etching back this material until the material layer 102f is exposed. The material of the spacer 108 includes, for example, silicon oxide or other suitable materials.

Figure 3A:
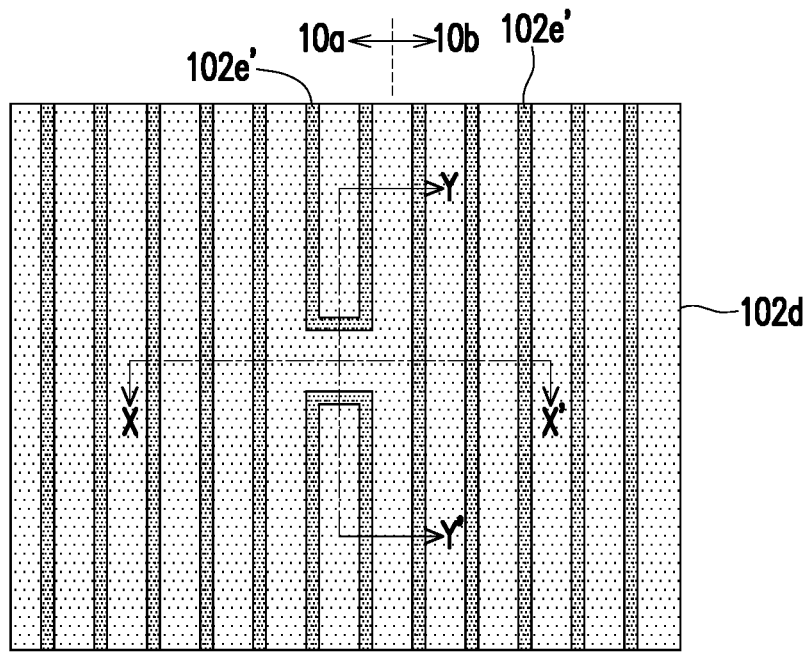
Figure 3B:
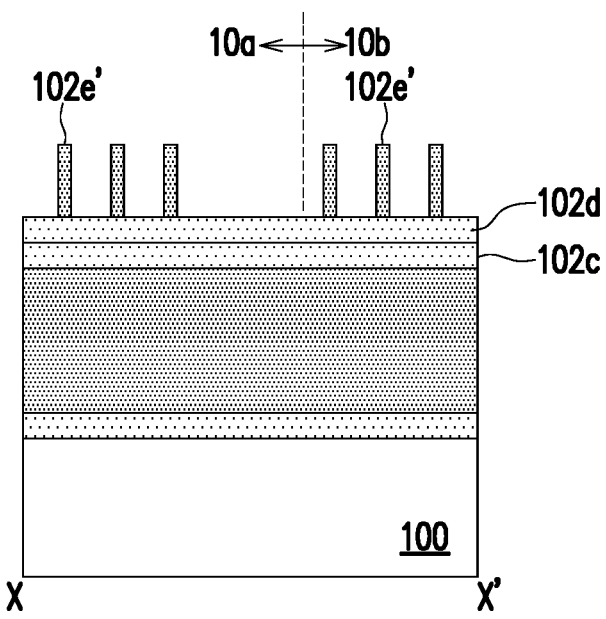
Figure 3C:
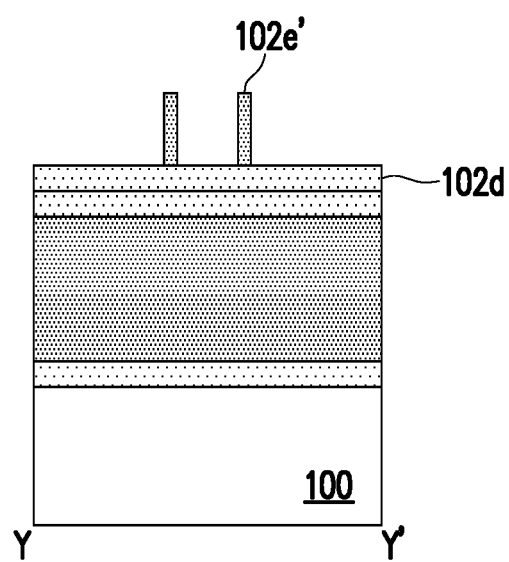

Then, with reference to FIGS. 3A, 3B, and 3C, after removal of the line patterns and the connection block (that is, 104 and 106 in the preceding figures), the spacer (that is, 108 in the preceding figures) is used as an etching mask to transfer its pattern to the exposed material layer (that is, 102*f* in the preceding figures). The patterned material layer is then used as an etching mask to transfer its pattern to the material layer (that is, 102*e* in the preceding figures) underneath, and a patterned material layer 102*e'* is formed and the material layer 102*d* is exposed. The material layer above the patterned material layer 102*e'* may also be removed after this step.

Figure 4A:
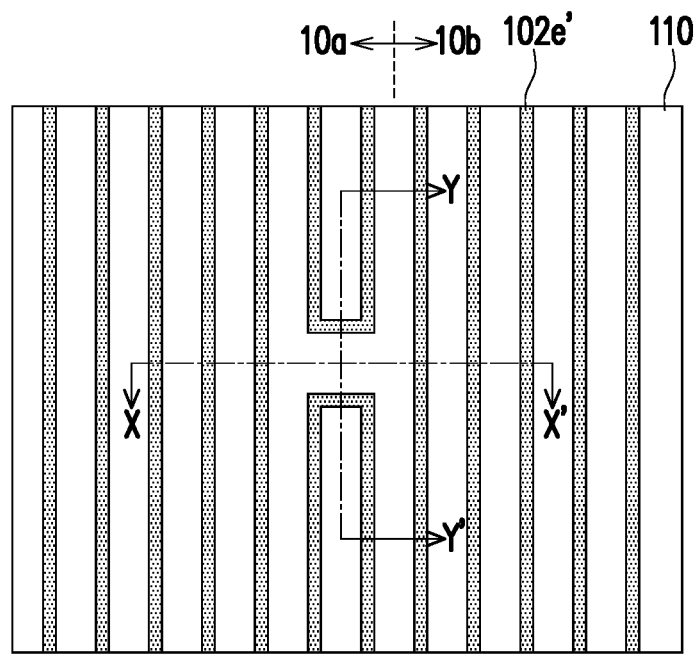
Figure 4B:
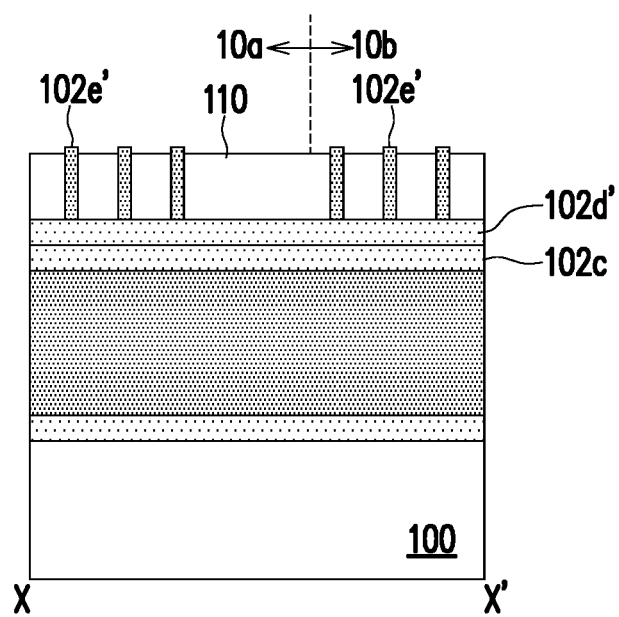
Figure 4C:
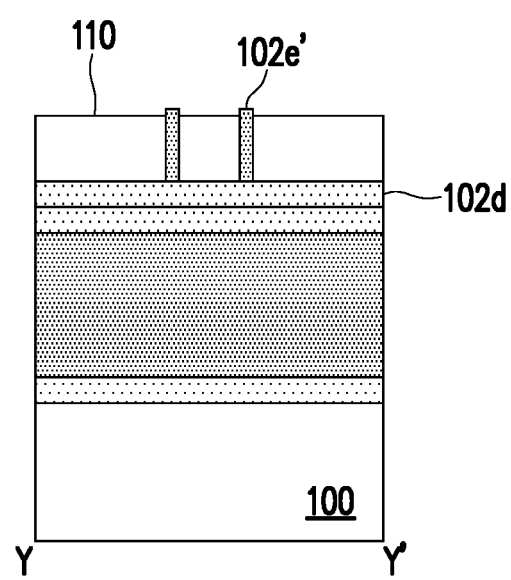

Thereafter, with reference to FIGS. 4A, 4B and 4C, an oxide layer 110 is deposited on the semiconductor substrate 100, and the oxide layer 110 is etched back to expose the top of the patterned material layer 102*e'*.

Figure 5A:
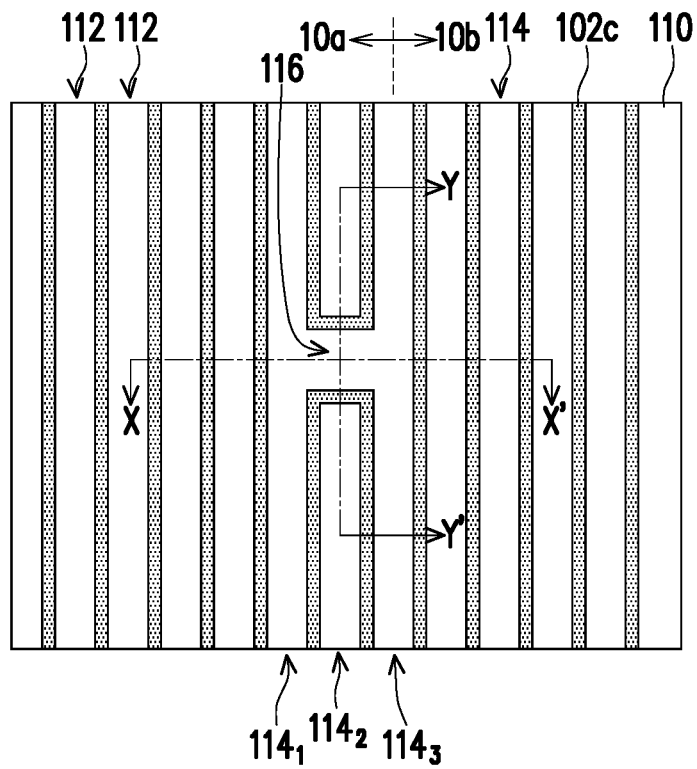
Figure 5B:
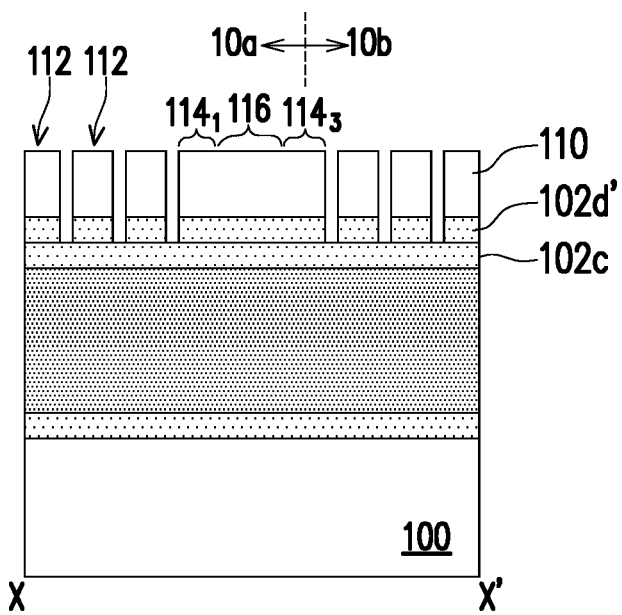
Figure 5C:
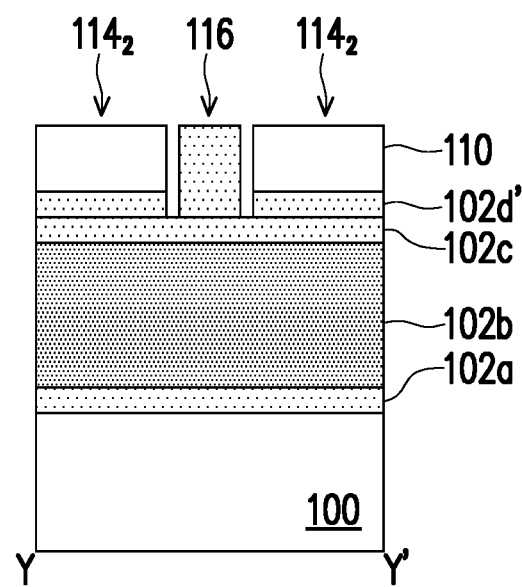

Next, with reference to FIGS. 5A, 5B and 5C, after removal of the patterned material layer (that is, 102*e'* in the preceding figures), the oxide layer 110 is used as an etching mask to transfer its pattern to the exposed material layer (that is, 102*d* in the preceding figures), and a patterned material layer 102*d'* is formed and the material layer 102*c* is exposed.

The oxide layer 110 and the patterned material layer 102*d'* at this stage may be regarded as a mask layer after patterning, because the material layers 102*a* to 102*c* below maintain the same pattern in the cell region 10*a* in subsequent processes. The oxide layer 110 and the patterned material layer 102*d'* in the cell region 10*a* constitute multiple dense line patterns 112, while multiple dummy dense line patterns 114 are distributed in an interface region between the cell region 10*a* and the peripheral region 10*b*. The dummy dense line patterns 114 are also distributed in the peripheral region 10*b*. Here, the term "dummy" is used to describe a structure to be removed in a subsequent substitution process or a functionless structure. At least one connection portion 116 is provided between a first dummy dense line pattern 114$_1$ and a third dummy dense line pattern 114$_3$, and a second dummy dense line pattern 114$_2$ is discontinuous at the connection portion 116 and separated from the connection portion 116.

Figure 6A:
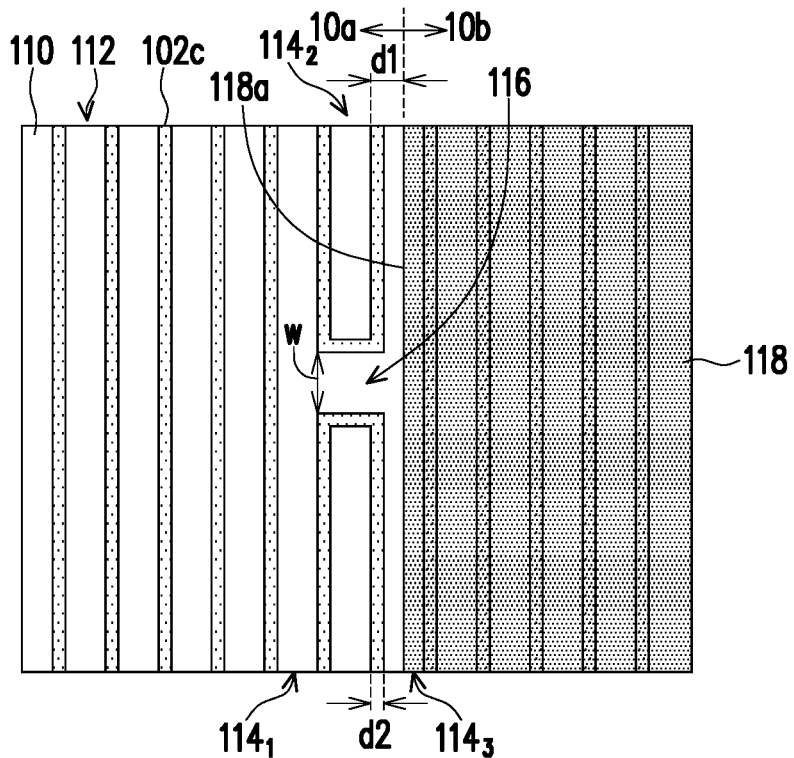
Figure 6B:
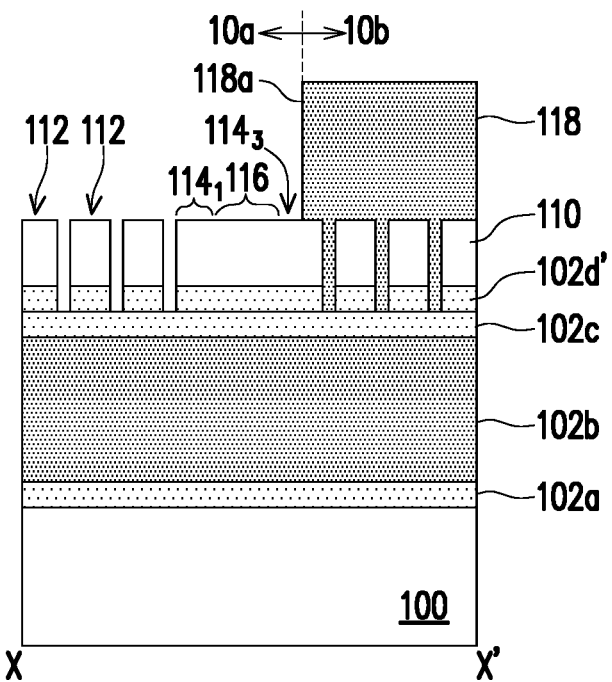
Figure 6C:
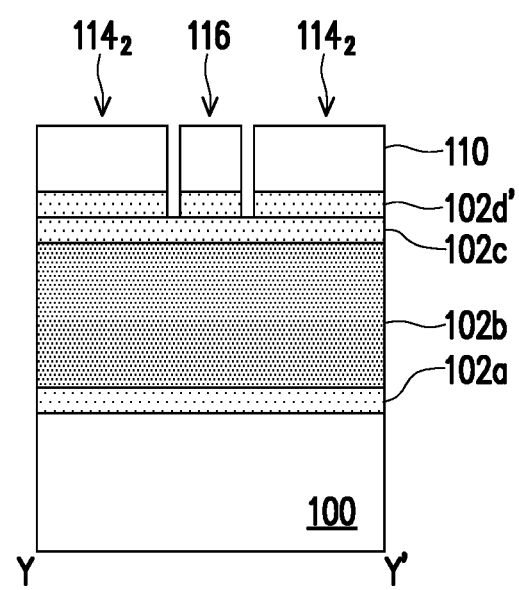

Then, with reference to FIGS. 6A, 6B, and 6C, a photoresist layer 118 covering the peripheral region 10*b* is formed on the semiconductor substrate 100. For clarity, the markings X-X' and Y-Y' are omitted in FIG. 6A. Due to the presence of the connection portion 116, a boundary between the cell region 10*a* and the peripheral region 10*b* may be determined directly according to visual observation (such as by an optical microscopy (OM) or scanning electron microscopy (SEM) image). After that, whether a landing position of the photoresist layer 118 is correct may be determined according to a distance d1 from an edge 118*a* of the photoresist layer 118 to the dummy dense line pattern 114$_2$ that is closest to the edge 118*a* and a width w of the connection portion 116. Here, the "width" of the connection portion 116 refers to a dimension of the connection portion 116 parallel to an extension direction of the dummy dense line patterns 114.

In detail, in a case where the photoresist layer 118 is set to cover the third dummy dense line pattern 114$_3$, if the distance d1 from the edge 118*a* of the photoresist layer 118 to the closest dummy dense line pattern 114$_2$ is smaller than a distance d2 between the third dummy dense line pattern 114$_3$ and the second dummy dense line pattern 114$_2$, it is determined that the landing position of the photoresist layer 118 is incorrect. In a case where the edge 118*a* of the photoresist layer 118 is set to land precisely in the center of the third dummy dense line pattern 114$_3$, if the distance d1 from the edge 118*a* of the photoresist layer 118 to the closest dummy dense line pattern 114$_2$ is not equal to a sum of the distance d2 and half of a line width of the third dummy dense line pattern 114$_3$, it is determined that the landing position of the photoresist layer 118 is incorrect. However, the disclosure is not limited thereto, and tolerances are allowed in the above settings.

In addition, even if the edge 118*a* of the photoresist layer 118 is shifted onto the second dummy dense line pattern 114$_2$, there is a possibility that the distance d1 may still meet the aforementioned specification value. Therefore, it is necessary to perform a double check by measuring the width w of the connection portion 116. An instrument such as a critical dimension scanning electron microscope (CD-SEM) is generally used to measure a set landing position. As shown in FIG. 6A, the measurement of the width w is performed on a portion at a fixed spacing apart from the edge 118*a*. Thus, when the edge 118*a* is shifted onto the second dummy dense line pattern 114$_2$, the instrument is unable to obtain a measured value and the landing position of the photoresist layer 118 is determined to be incorrect.

In another embodiment, in a case where the photoresist layer 118 is set to cover the second dummy dense line pattern 114$_2$, if a distance from the edge 118*a* of the photoresist layer 118 to the dummy dense line pattern 114$_1$ that is closest to the edge 118*a* is smaller than a distance between the first dummy dense line pattern 114$_1$ and the second dummy dense line pattern 114$_2$, the landing position of the photoresist layer 118 is determined to be incorrect. Even if the determination result is positive, it is necessary to measure the width w of the connection portion 116 by the CD-SEM. If a measured value cannot be obtained, it is determined that the landing position of the photoresist layer 118 is incorrect, and so on.

Figure 7A:
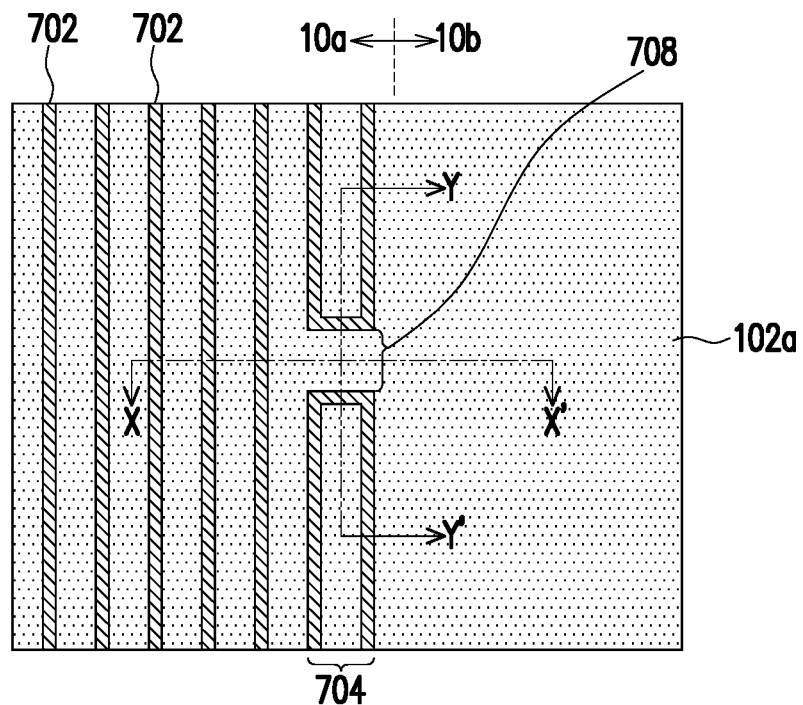
FIG. 7A is a schematic top view of a semiconductor device according to a second embodiment of the disclosure.
Figure 7B:
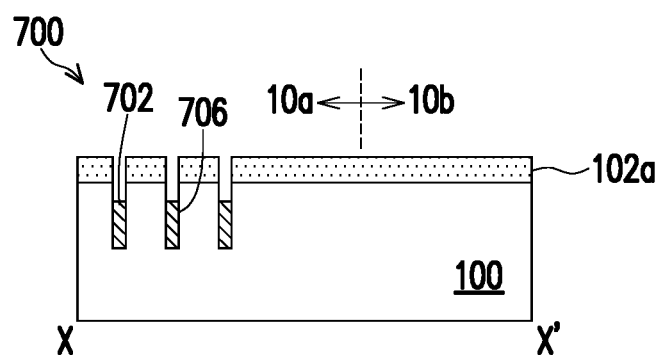
FIG. 7B is a schematic cross-sectional view of FIG. 7A taken along the line X-X'.
Figure 7C:
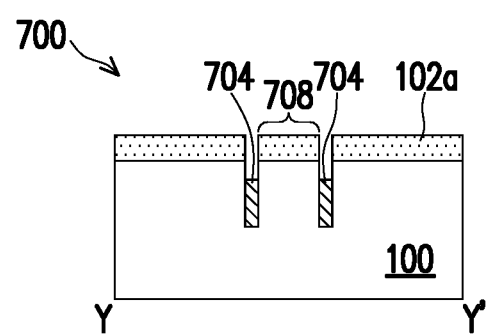
FIG. 7C is a schematic cross-sectional view of FIG. 7A taken along the line Y-Y'.

FIG. 7A is a schematic top view of a semiconductor device according to a second embodiment of the disclosure. FIG. 7B is a schematic cross-sectional view of FIG. 7A taken along the line X-X'. FIG. 7C is a schematic cross-sectional view of FIG. 7A taken along the line Y-Y'. Moreover, in the second embodiment, the same reference numerals as those of the first embodiment denote the same components and reference may be made to the foregoing descriptions. Therefore, the same technical content is omitted.

With reference to FIGS. 7A, 7B, and 7C, a semiconductor device 700 of the second embodiment includes the semiconductor substrate 100 that includes the cell region 10*a* and the peripheral region 10*b*, multiple dense line structures 702 and a truncating circuit 704. The semiconductor device 700 uses the photoresist layer 118, the dummy dense line patterns 114 and the dense line patterns 112 of FIG. 6A as a mask to carry out a series of etching processes as follows. First, a trench 706 is formed in the semiconductor substrate 100. Then, the material layers above the material layer 102*a* are removed, and a conductor material is filled. Therefore, the dense line structures 702 and the dense line patterns 112 of FIG. 6A are complementary patterns. The truncating circuit 704 is disposed on an interface between the dense line structures 702 and the peripheral region 10*b*. As described above, the truncating circuit 704 uses the photoresist layer 118 and the dummy dense line patterns 114 of FIG. 6A as a mask. Therefore, the truncating circuit 704 and the first dummy dense line pattern 114$_1$ to the third dummy dense line pattern 114$_3$ of FIG. 6A are complementary patterns, and the truncating circuit 704 has at least one truncating portion 708 complementary to the connection portion 116 of FIG. 6A. In FIG. 7A, the truncating circuit 704 is constituted by two closed rings, the truncating portion 708 is disposed between the two closed rings, and a line width of each closed ring may be equal to or not equal to a line width of the dense line structures 702. In the embodiment, the dense line structures 702 are, for example, buried word lines (BWL). However, the disclosure is not limited thereto, and the dense line structures 702 may also be shallow trench isolation (STI) structures or bit lines (BL). If the dense line structures 702 are STI structures, the trench 706 is filled with an insulating material; if the dense line structures 702 are BL, the trench 706 may not be formed, and a deposition process may be directly carried out on the semiconductor substrate 100.

Figure 8A:
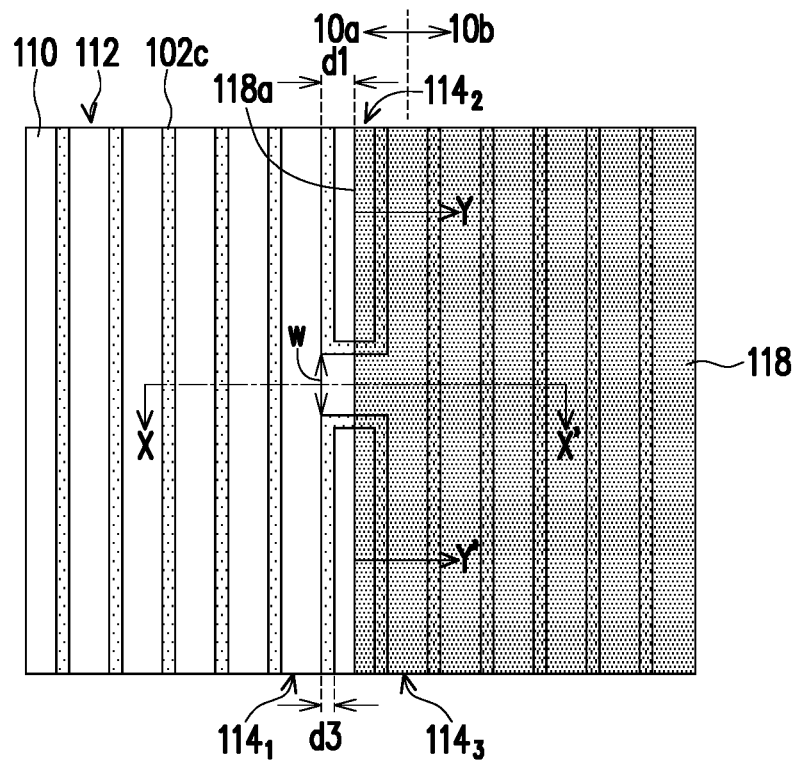
FIG. 8A is a schematic top view of a recognition method for a photolithography process according to a third embodiment of the disclosure.
Figure 8B:
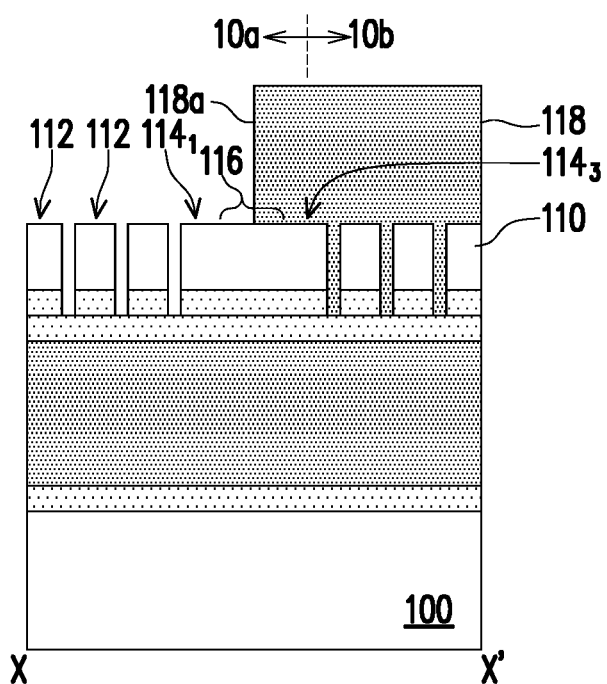
FIG. 8B is a schematic cross-sectional view of FIG. 8A taken along the line X-X'.
Figure 8C:
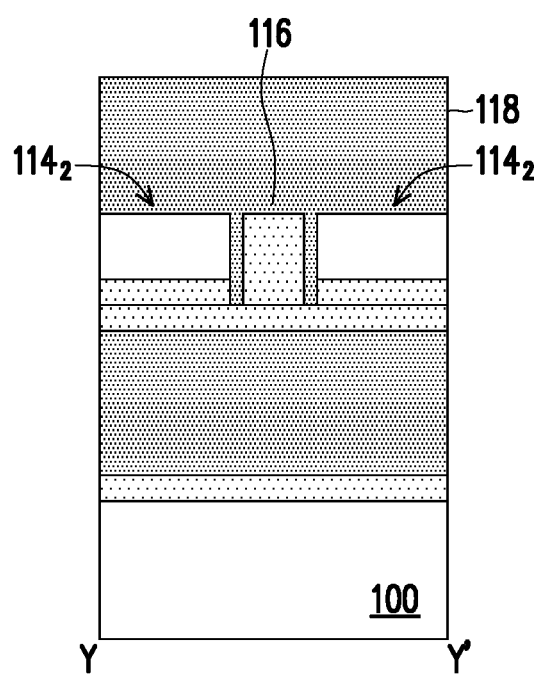
FIG. 8C is a schematic cross-sectional view of FIG. 8A taken along the line Y-Y'.

FIG. 8A is a schematic top view of a recognition method for a photolithography process according to a third embodiment of the disclosure. FIG. 8B is a schematic cross-sectional view of FIG. 8A taken along the line X-X'. FIG. 8C is a schematic cross-sectional view of FIG. 8A taken along the line Y-Y'. Moreover, reference may be made to the front-end process (as shown in FIGS. 1A to 5C) of the first embodiment for the manufacturing process of the third embodiment. In the third embodiment, the same reference numerals as those of the first embodiment denote the same components, and reference may be made to the foregoing descriptions. Therefore, the same technical content is omitted.

With reference to FIGS. 8A, 8B and 8C, in the case where the photoresist layer 118 is set to cover the second dummy dense line pattern $114_2$, when the distance d1 from the edge 118a of the photoresist layer 118 to the dummy dense line pattern $114_1$ that is closest to the edge 118a is less than a distance d3 between the first dummy dense line pattern $114_1$ and the second dummy dense line pattern $114_2$, it is determined that the landing position of the photoresist layer 118 is incorrect. Even if the determination result is positive, it is necessary to measure the width w of the connection portion 116 by the CD-SEM. If a measured value cannot be obtained, it is determined that the landing position of the photoresist layer 118 is incorrect, and so on.

Figure 9:
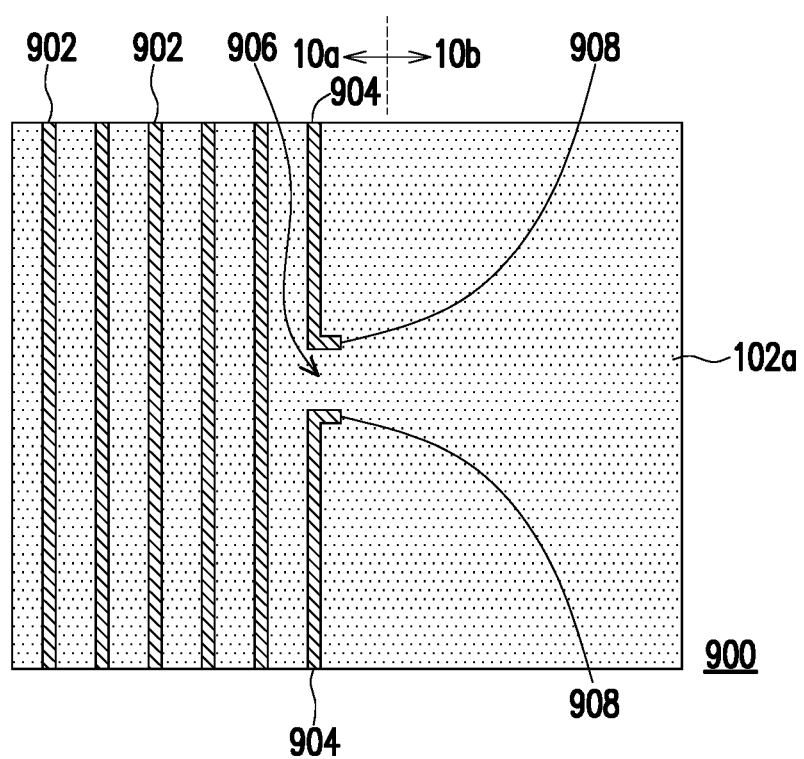
FIG. 9 is a schematic top view of a semiconductor device according to a fourth embodiment of the disclosure.

In a case where the landing position of the photoresist layer 118 is correct, the photoresist layer 118, the dummy dense line patterns 114, and the dense line patterns 112 of FIG. 8A are used as a mask to carry out a series of processes as described in the second embodiment, and a semiconductor device 900 as shown in FIG. 9 may be formed. The semiconductor device 900 includes dense line structures 902 and a truncating circuit 904. This embodiment is different from the second embodiment in that the truncating circuit 904 is linear like the dense line structures 902, and that multiple extensions 908 adjacent to a truncating portion 906 and extending toward the peripheral region 10b are further provided. A line width of the truncating circuit 904 may be equal to or not equal to a line width of the dense line structures 902. The other content omitted here may be understood with reference to the second embodiment.

In addition to determining whether the landing position of the photoresist layer is correct, with reference to FIGS. 10A and 10B, the first embodiment may also be applied to detection of critical dimension (CD) and overlap.

FIG. 10A shows a reduced view of FIG. 6A, where the cell region 10a is between the peripheral regions 10b, and the interface between the cell region 10a and the peripheral regions 10b may be observed from the connection portion 116. Two distances d1a and d1b between opposite sides (that is, from the edge 118a to the closest dummy dense line patterns 114) of the photoresist layer 118 obtained by a photolithography process may be used to estimate a CD value of the photoresist layer 118. If the two distances d1a and d1b are smaller than a set value, it means that the cell region 10a will become smaller after this photolithography process, and parameters of the subsequent photolithography process should be adjusted. If the two distances d1a and d1b are greater than the set value, it means that the cell region 10a will become larger after this photolithography process, and parameters of the subsequent photolithography process should also be adjusted.

FIG. 10B is the same as FIG. 10A except for the landing position of the photoresist layer 118. The distance d1a and the distance d1b are obviously different. Therefore, an overlap amount may be measured from a difference between the distances d1a and d1b between opposite sides to verify whether the overlap between the layers is correct.

In summary, in the disclosure, by marking the interface between the cell region and the peripheral region with the dummy dense line pattern including at least one connection portion, the boundary between the cell region and the peripheral region can be directly determined without the need for performing additional optical proximity correction (OPC). According to the distance from the edge of the photoresist layer to the closest dummy dense line pattern and the width of the connection portion, it is possible to online recognize whether the landing position of the photoresist layer is correct. In addition, the above recognition method may also be applied to detection of CD and overlap.

What is claimed is:

1. A recognition method for a photolithography process, comprising:
    forming a mask layer on a semiconductor substrate, the semiconductor substrate comprising a cell region and a peripheral region;
    patterning the mask layer to form a plurality of dense line patterns in the cell region, and to form a plurality of dummy dense line patterns in an interface region between the cell region and the peripheral region, wherein at least one connection portion is provided between a first and a third of the plurality of dummy dense line patterns, and a second of the plurality of dummy dense line patterns is discontinuous at the at least one connection portion and is separated from the at least one connection portion;
    forming on the semiconductor substrate a photoresist layer covering the peripheral region; and
    determining whether a landing position of the photoresist layer is correct according to a distance from an edge of the photoresist layer to a closest one of the plurality of dummy dense line patterns and a width of the at least one connection portion.

2. The recognition method for the photolithography process according to claim 1, wherein in a case where the photoresist layer is set to cover the first of the plurality of dummy dense line patterns, the landing position of the photoresist layer is determined to be incorrect in response to the distance from the edge of the photoresist layer to the closest one of the plurality of dummy dense line patterns being smaller than a distance between the first and the second of the plurality of dummy dense line patterns.

3. The recognition method for the photolithography process according to claim 1, wherein in a case where the photoresist layer is set to cover the first of the plurality of dummy dense line patterns, the landing position of the photoresist layer is determined to be incorrect in response to a measured value being unable to be obtained by a critical dimension scanning electron microscope (CD-SEM).

4. The recognition method for the photolithography process according to claim 1, wherein in a case where the photoresist layer is set to cover the second of the plurality of dummy dense line patterns, the landing position of the photoresist layer is determined to be incorrect in response to the distance from the edge of the photoresist layer to the closest one of the plurality of dummy dense line patterns being smaller than a distance between the first and the second of the plurality of dummy dense line patterns.

5. The recognition method for the photolithography process according to claim 1, wherein in a case where the photoresist layer is set to cover the second of the plurality of dummy dense line patterns, the landing position of the photoresist layer is determined to be incorrect in response to a measured value being unable to be obtained by a CD-SEM.

6. The recognition method for the photolithography process according to claim 1, further comprising estimating a critical dimension (CD) value of the photoresist layer according to a value of the distance between opposite sides.

7. The recognition method for the photolithography process according to claim 1, further comprising measuring an overlap amount according to a difference in the distance between opposite sides.

8. The recognition method for the photolithography process according to claim 1, wherein the mask layer is formed using a self-aligned double patterning (SADP) process.

9. A semiconductor device, comprising:
a plurality of dense line structures obtained by carrying out an etching process or a deposition process using the plurality of dense line patterns in the recognition method according to claim 1 as a mask, wherein the plurality of dense line structures are formed in the semiconductor substrate or on the semiconductor substrate, and the plurality of dense line structures and the plurality of dense line patterns are complementary patterns; and
a truncating circuit disposed on an interface between the plurality of dense line structures and the peripheral region, wherein the truncating circuit is obtained by carrying out an etching process or a deposition process using the photoresist layer and the plurality of dummy dense line patterns in the recognition method according to claim 1 as a mask, and the truncating circuit and the first to the third of the plurality of dummy dense line patterns are complementary patterns, wherein the truncating circuit has at least one truncating portion complementary to the at least one connection portion of the dummy dense line patterns.

10. The semiconductor device according to claim 9, wherein the plurality of dense line structures comprise a buried word line, a bit line, or a shallow trench isolation structure.

11. The semiconductor device according to claim 9, wherein a line width of the truncating circuit is equal to a line width of the plurality of dense line structures.

12. The semiconductor device according to claim 9, wherein the truncating circuit comprises a plurality of extensions adjacent to the at least one truncating portion and extending toward the peripheral region.

13. The semiconductor device according to claim 9, wherein the truncating circuit is constituted by a plurality of closed rings, and the at least one truncating portion is disposed between two of the plurality of closed rings.

14. The semiconductor device according to claim 13, wherein a line width of each of the plurality of closed rings is equal to a line width of the plurality of dense line structures.

* * * * *